United States Patent [19]

Pelc

[11] Patent Number: 4,612,504

[45] Date of Patent: Sep. 16, 1986

[54] METHOD FOR REMOVING THE EFFECTS OF BASELINE ERROR COMPONENTS IN NMR IMAGING APPLICATIONS

[75] Inventor: Norbert J. Pelc, Wauwatosa, Wis.

[73] Assignee: General Electric Company, Milwaukee, Wis.

[21] Appl. No.: 673,691

[22] Filed: Nov. 21, 1984

[51] Int. Cl.$^4$ ............................................. G01R 33/20
[52] U.S. Cl. ..................................... 324/309; 324/314
[58] Field of Search .............. 324/300, 309, 307, 311, 324/312, 313, 314; 128/653

[56] References Cited

U.S. PATENT DOCUMENTS

| | | | |
|---|---|---|---|
| 4,443,760 | 4/1984 | Edelstein | 324/309 |
| 4,549,139 | 10/1985 | MacFall | 324/309 |
| 4,549,140 | 10/1985 | MacFall | 324/309 |
| 4,567,893 | 2/1986 | Charles | 324/309 |

Primary Examiner—Michael J. Tokar
Attorney, Agent, or Firm—Alexander M. Gerasimow; Douglas E. Stoner

[57] ABSTRACT

A preferred embodiment of a method of removing the effects of nuclear magnetic resonance (NMR) signal baseline error artifacts in imaging applications is disclosed with reference to Fourier transform imaging techniques, of the type frequently referred to as spin warp. In accordance with the method, the phase of the radio frequency (RF) excitation pulse is alternated in adjacent phase-encoding views by 180°. Since the baseline error component is independent of this phase change, the effect of phase reversal of the RF excitation is to modulate the desired image up to the Nyquist frequency in the phase-encoding direction. The artifact due to the baseline error component, however, is unchanged. Views measured with −90° RF excitation are negated prior to reconstruction so that the image is returned to its correct position, while the baseline error artifact is modulated to the edge of the field of view. Since the baseline artifact has limited bandwidth, it does not interfere with the desired image. Because only one measurement is made at each phase-encoding gradient amplitude, the minimum scan time can be halved, the field of view can be doubled, or the resolution in the phase-encoding direction can be doubled.

25 Claims, 6 Drawing Figures

METHOD FOR REMOVING THE EFFECTS OF BASELINE ERROR COMPONENTS IN NMR IMAGING APPLICATIONS

BACKGROUND OF THE INVENTION

This invention relates to a method for performing nuclear magnetic resonance (NMR) studies. More specifically, this invention relates to an NMR method useful for performing NMR studies in a shorter time, but with a substantial reduction in baseline error effects.

U.S. Pat. No. 3,781,650 discloses a method for reducing interference in the receiver of a spin resonance spectrometer. In accordance with the method, a first set of radio frequency (RF) excitation pulses of one phase angle, and a second set of RF excitation pulses which are 180° out of phase with the first set are generated. The free precession decay signals produced by one set of pulses is subtracted from the free precession decay signals produced by the other set. The signals from the excited sample reinforce, while the interference signals cancel.

The method is disclosed in the above-identified Patent with respect to an NMR analytical spectrometer and, therefore, is not concerned with scan-time reduction and magnetic field gradients effects, as is the case in NMR imaging studies of human subjects. Scan-time reduction is important in the study of human subjects to increase patient throughput in the case of medical application of NMR and to decrease the likelihood of artifacts induced by patient motion. Magnetic field gradients are needed in NMR studies, such as imaging, to encode spatial information into the NMR signal to enable image reconstruction.

U.S. Pat. No. 4,443,760, assigned to the same assignee as the present invention and which is incorporated herein by reference, discloses and claims a method for eliminating interference from spurious free induction decay (FID) signals created by imperfect 180° RF time-reversal pulses utilized to produce NMR spin-echo signals. One way this is accomplished is to phase shift by 180° relative to one another successive excitation pulses and subtracting the resulting NMR signals thereby eliminating the spurious FID signals. This method is also effective in eliminating other error components such as d.c. voltage offsets and residual effects associated with magnetic field gradients. The spurious FID signals, d.c. voltage offsets and residual effects of gradients and vibration of the RF coils used to detect NMR signals will be hereinafter collectively referred to as "baseline error component." Another way to eliminate the effects of spurious FID signals is to phase shift successive spin-echo-producing 180° RF pulses and to add the NMR signals. The spurious FID signals are phase shifted and cancel, while the desired signals reinforce. It is necessary to reduce or eliminate baseline error components, since their presence severely degrades image quality.

Although the above-described technique works satisfactorily, there is a drawback associated with the use of phase-alternated RF excitation of the type described above with reference to U.S. Pat. No. 4,443,760, in that in NMR imaging applications the imaging pulse sequence is repeated with the sign of the 90° RF pulse reversed. In some applications, this may be desirable, since not only is the baseline error removed, but the signal-to-noise ratio is improved. In some systems, notably those utilizing high magnetic fields (1.5 tesla), the signal-to-noise ratio may not require enhancement. In this case, the effects of baseline error components are reduced at the expense of increased data collection time.

Another method which is effective in reducing baseline error components, while shortening data collection time, is disclosed and claimed in U.S. patent application Ser. No. 663,659, filed by G. H. Glover and J. R. MacFall, which is assigned to the same assignee as the present invention. The method of the referenced patent application will be described in greater detail hereinafter. Briefly, however, in accordance with the method, it is recognized that the baseline error component does not change rapidly in the course of a scan. Specifically, the baseline error is a slowly varying function of the applied magnetic field gradients. It is possible, therefore, to duplicate relatively small portions of the overall sequence and use this information to calculate a value for the baseline error component. The method of alternating the sign of the 90° RF pulse (i.e., as used herein to indicate alternation of the phase of the RF pulse by 180°) can be used periodically to calculate an exact baseline error for only some of the measurements, and these can then be used to compensate for errors in other NMR signals. This is an effective method for reducing the effects of baseline error components, although at a decreased (compared to the method disclosed in the aforeidentified U.S. Pat. No. 4,443,760) data collection time due to the need to duplicate portions of the pulse sequence. However, some errors can be introduced by the interpolation used to generate baseline error estimates for the NMR signals for which the baseline was not measured directly.

It is, therefore, a principal object of the invention to provide an accurate method for reducing the effects of baseline error components in NMR images without duplicating portions of the scan sequence, thereby shortening the total data collection time.

SUMMARY OF THE INVENTION

In accordance with the invention, there is provided a method for removing the effects of NMR signal baseline error components in NMR imaging techniques. The method includes a predetermined plurality of sequentially implemented views each of which includes the application of an RF excitation pulse and a magnetic field gradient pulse along at least one dimensional axis of a study object. The magnetic field gradient may cause the NMR signal to correspond to a projection along a particular direction as is used in the projection reconstruction method, or it may be a phase-encoding gradient as is used in the Fourier transform imaging techniques. The phase of the RF excitation pulse is phase alternated by 180° for measurements made with adjacent gradient amplitudes or directions. The NMR signals due to the RF excitation pulses are observed and alternate ones thereof are negated prior to constructing an image of the study object.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
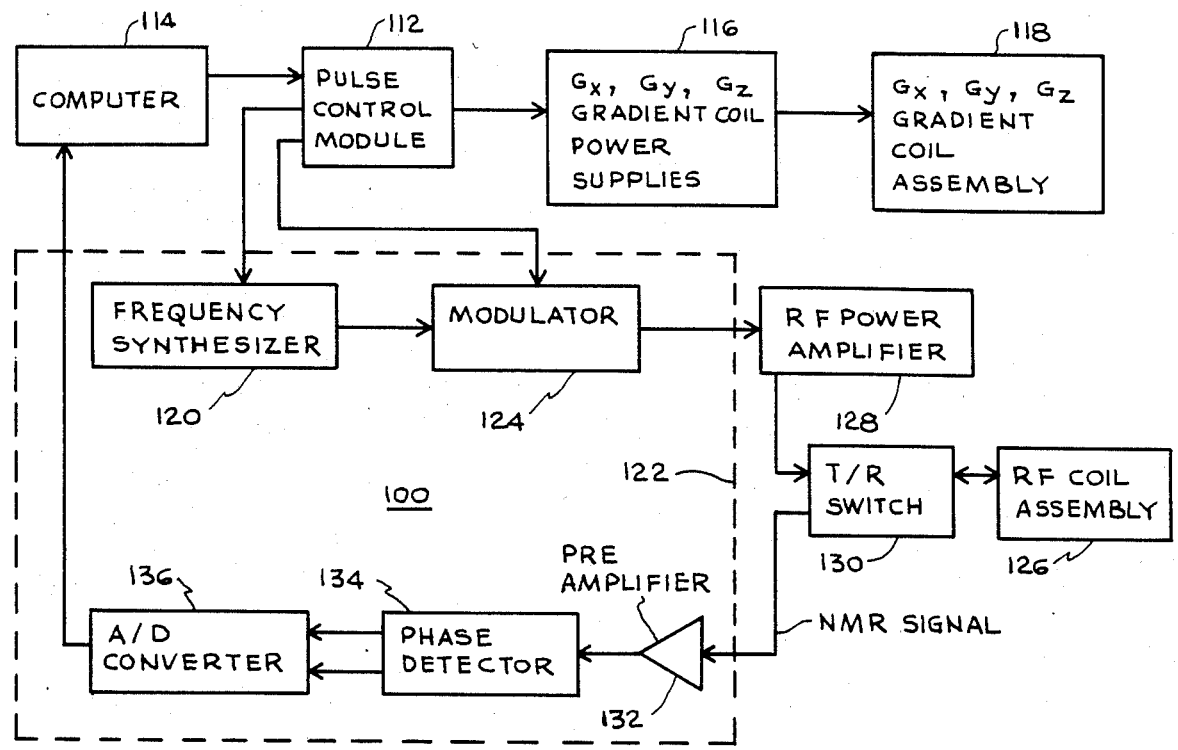
FIG. 1 depicts in block schematic form an exemplary NMR system useful for practicing the invention.

FIG. 1 is a simplified block diagram of an NMR imaging system with respect to which the preferred embodiment of the invention will be disclosed. It should be recognized, however, that the claimed invention may be advantageously practiced with any suitable NMR apparatus. The system, generally designated 100, includes a pulse control module 112 which provides properly timed pulse signal waveforms, under the control of a host computer 114, to magnetic field gradient power supplies, collectively designated 116, for energizing gradient coils which form part of a gradient coil assembly generally indicated by a block 118. The assembly contains coils which, when energized by the power supplies, produce the $G_x$, $G_y$, and $G_z$ magnetic field gradients (of the magnetic field in the z direction) directed in the x, y, and z directions, respectively, of the Cartesian coordinate system. The use of the $G_x$, $G_y$, and $G_z$ gradients in NMR imaging applications will be described hereinafter with reference to FIGS. 2, 3 and 4.

Continuing with reference to FIG. 1, the pulse control module provides activating pulses to an RF synthesizer 120 which is part of an RF transceiver system, portions of which are enclosed by dash-line block 122. The pulse control module also supplies modulating signals to a modulator 124 which modulates the output of the RF frequency synthesizer. The modulated RF signals are applied to an RF coil assembly 126 through an RF power amplifier 128 and a transmit/receive switch 130. The RF signals are used to excite nuclear spins in a sample object (not shown) undergoing examination.

The NMR signals from the excited nuclear spins are picked up by the RF coil assembly and applied through the transmit/receive switch to an RF preamplifier 132 and then to a quadrature phase detector 134. The detected signals are digitized by A/D converter 136 and applied to computer 114 for processing in a well-known manner to, for example, reconstruct NMR images of the sample.

For the purpose of this discussion, a view will be defined as being a set of NMR measurements made with the same position-encoding gradients. Thus, a view may contain measurements obtained with the sign of the 90° RF pulses alternated, or repeat measurements to improve the signal-to-noise ratio. During a scan, a discrete set of the magnetic field gradient values are used to provide spatial information. Again, for the purpose of this discussion, views are "adjacent" if neighboring values of the gradient amplitudes are used to acquire them. Adjacent views are not necessarily acquired sequentially in time. Further, the component signals for one view need not be acquired sequentially in time although this is usually the case.

The inventive method of reducing baseline artifacts can be used for both projection reconstruction and Fourier methods, and for two-dimensional or higher dimensional imaging. It will be described first and in most detail with reference to the most commonly used imaging method, the two-dimensional Fourier transform technique.

Figure 2:
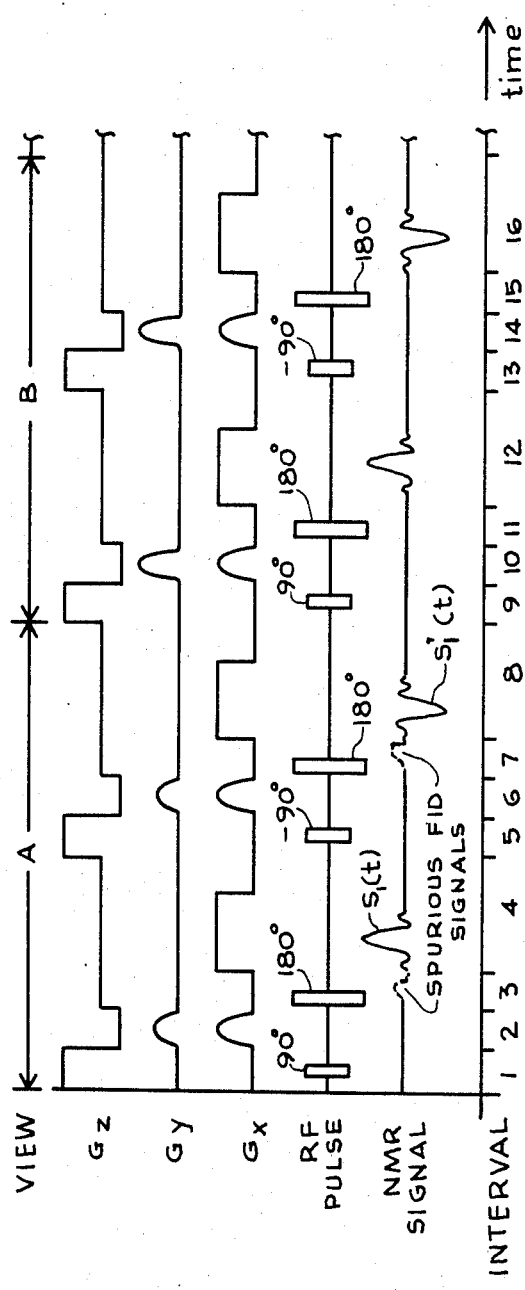
FIG. 2 depicts an exemplary imaging pulse sequence over which the present invention is an improvement.

Initial reference is made to FIG. 2 which depicts two views of what can now be referred to as a conventional imaging pulse sequence of the type known as two-dimensional Fourier transform (2DFT), which is frequently also referred to as two-dimensional "spin warp," and with respect to which the improvement of the present invention may be appreciated. This pulse sequence is useful in obtaining, in a well-known manner, imaging data to reconstruct images of a sample being investigated. The pulse sequence utilizes phase-alternated RF excitation pulses which, as disclosed and claimed in the aforeidentified U.S. Pat. No. 4,443,760 and as will be briefly described hereinbelow, produce phase-alternated NMR signals. When these signals are subtracted, those signal components having an inverted phase reinforce, while baseline error components which are not phase reversed cancel. This is a result of the baseline error being insensitive to the sign of the 90° pulse.

The manner in which this is accomplished in the conventional pulse sequence will now be described with reference to FIG. 2 which depicts two phase-encoding views A and B of a pulse sequence which can in reality contain, for example, 128, 256, or 512 phase-encoding views. Each view in FIG. 2 is comprised of two NMR experiments. Referring now to View A in FIG. 2, there is shown in interval 1 (indicated along the horizontal axis) a selective 90° RF excitation pulse applied in the presence of a positive $G_z$ magnetic field gradient pulse. Pulse control module 112, FIG. 1, provides the needed control signals to the frequency synthesizer and modulator so that the resulting excitation pulse is of the correct phase and frequency to excite nuclear spins only in a predetermined region of the sample. Typically, the excitation pulse can be amplitude modulated by a (sin x)/x function. The frequency of the synthesizer is dependent on the strength of the applied magnetic field and the NMR species being imaged in accordance with the well-known Larmor equation. The pulse control module also applies activating signals to the gradient power supplies to generate, in this case, the $G_z$ gradient pulse.

Continuing with reference to FIG. 2, $G_x$, $G_y$, and $G_z$ gradient pulses are applied simultaneously in interval 2. The $G_z$ gradient in interval 2 is a rephasing pulse typically selected such that the time integral of the gradient waveform over interval 2 is approximately equal to $-\frac{1}{2}$ of the time integral of the gradient waveform over interval 1. The function of the negative $G_z$ pulse is to rephase the nuclear spins excited in interval 1. The $G_y$ gradient pulse is a phase-encoding pulse selected to have a different amplitude in each of Views A, B, . . . , etc., to encode spatial information in the direction of the gradient. The number of different $G_y$ gradient amplitudes is typically selected to equal at least the number of pixel elements the reconstructed image will have in the Y-axis direction. Typically, 128, 256 or 512 different gradient amplitudes are selected.

The $G_x$ gradient pulse in interval 2 is a dephasing pulse needed to dephase the excited nuclear spins by a predetermined amount to delay the time of occurrence of a spin-echo signal $S_1(t)$ in interval 4. The spin echo is produced by the application of a, typically, non-selective 180° RF pulse in interval 3. As is known, the 180° RF pulse is a time-reversal pulse which reverses the direction of spin dephasing so as to produce the spin-echo signal. The spin-echo signal is sampled in interval 4 in the presence of a linear $G_x$ gradient pulse to encode spatial information in the direction of this gradient.

Precise time-reversal pulses are difficult to produce. In practice, imperfect pulses do not reverse the direction of nuclear spins by exactly 180° throughout the sample object region of interest. In some parts of the region, the nuclear spins are rotated by less than or greater than 180°, creating a transverse magnetization component which is responsible for a spurious free induction decay (FID) NMR signal (shown by dashed lines in View A, FIG. 2) which is unavoidably detected along with the desired spin-echo signal. The spurious NMR signal, along with other baseline error components can produce objectionable image artifacts.

In the pulse sequence of FIG. 2, baseline error components are eliminated by using an additional NMR experiment in View A. This second experiment is substantially identical to the first with the exception that the RF excitation pulse in interval 5 of View A is selected to be 180° out of phase (as suggested by the minus sign) relative to the excitation pulse in interval 1 of View A, so that the resulting spin-echo signal $S_1'(t)$ in interval 8 is 180° out of phase with the spin-echo signal $S_1(t)$ in interval 4. The phase of the spurious FID signal occurring in intervals 7 and 8 due to the 180° RF pulse in interval 7, however, remains the same relative to the FID signal in interval 3. In this manner, if signals $S_1(t)$ and $S_1'(t)$ are subtracted, only those components of the signals with reversed (negative) sign in the signal $S_1'(t)$ are retained. The baseline error components cancel in a similar manner.

The operation of cancelling the baseline error components can be summarized by considering equations $$S_1(t) = S(t) + B(t) \quad (1)$$

$$S_1'(t) = -S(t) + B(t) \quad (2)$$

in which $S_1(t)$ and $S_1'(t)$ represent the spin-echo signals in intervals 4 and 8, respectively, $S(t)$ is the desired component of the NMR signal, and $B(t)$ is the baseline error component. The usual manner in which signals $S_1(t)$ and $S_1'(t)$ are processed is $$S(t) = \tfrac{1}{2}[S_1(t) - S_1'(t)] \quad (3)$$

which results in the elimination of the baseline error component $B(t)$. The operation indicated in Equation (3) also provides the expected $\sqrt{2}$ improvement in signal-to-noise ratio due to the averaging of the two signals.

The process described above with reference to View A is repeated for View B and so on for all amplitudes of the phase-encoding $G_y$ gradient.

The use of the pulse sequence depicted in FIG. 2 to eliminate baseline error components necessarily means that the minimum number of averages is two. With high-field imaging systems, however, the intrinsic signal-to-noise ratio can be high enough that two averages are not needed to produce a useful image. This means that the data collection time in situations not requiring the $\sqrt{2}$ advantage in signal-to-noise ratio is unnecessarily doubled.

It is also beneficial to consider in greater detail the baseline error reduction method disclosed and claimed in the aforeidentified patent application. In accordance with the method, it has been recognized that, if signals $S_1(t)$ and $S_1'(t)$, represented by Equations (1) and (2), respectively, are added instead of subtracted, the baseline error signal $B(t)$ can be recovered, rather than the desired NMR signal $S(t)$. That is $$B(t) = \tfrac{1}{2}[S_1(t) + S_1'(t)] \quad (4)$$

If the baseline signal determined using Equation (4) were independent of the phase-encoding gradient $G_y$, then it could be determined once using, for example, signals $S_1(t)$ and $S_1'(t)$ obtained in View A, FIG. 2. This baseline signal could then be used to compensate for the baseline error in all spin-echo signals corresponding to each amplitude of the phase-encoding gradient in subsequent views.

It has been determined, however, that there is sufficient variation in $B(t)$ as $G_y$ is stepped through its range of amplitudes, that one value of $B(t)$ does not accurately span the entire data set comprised of all views. It has been found, however, that, if a new baseline error $B(t)$ is determined periodically, for example, for every 4'th or 8'th ($N_b = 4$ or 8) amplitude of the phase-encoding gradient $G_y$, then the $B(t)$ signal follows the changes due to phase-encoding gradient $G_y$ to provide adequate compensation for the baseline error.

In general, therefore, in accordance with the method, it is necessary to replicate phase-encoding $G_y$ gradient amplitudes with phase-alternated excitation pulses only every $N_b$ views starting, for example, at the ($N_b/2$)th view. The baseline signal $B(t)$, computed using Equation (4), could be used to compensate for the signals nearest to a given view. A new $B(t)$ signal would be used every $N_b$ views.

A preferred imaging pulse sequence employing the above-described method will be described next with reference to FIG. 3.

Figure 3:
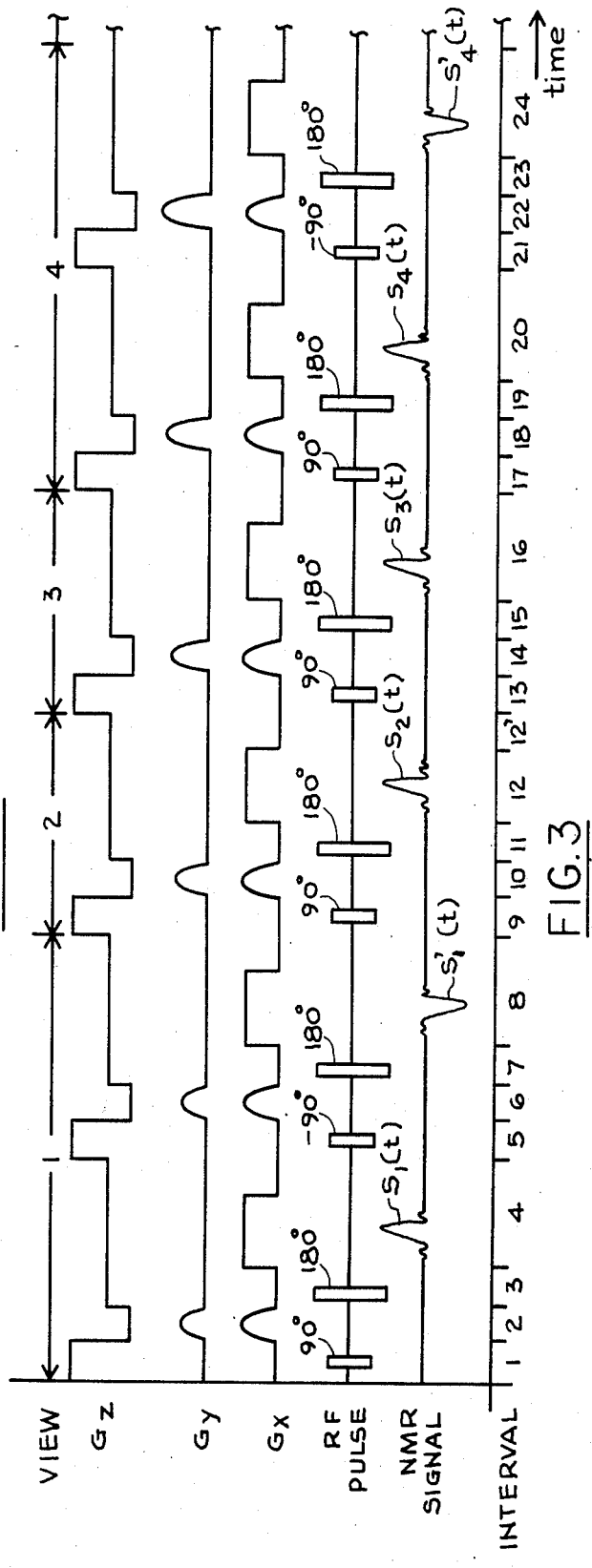
FIG. 3 depicts another exemplary imaging pulse sequence over which the present invention is an improvement.

FIG. 3 depicts four views of a 2DFT pulse sequence similar to that of FIG. 2. In this embodiment, $N_b$ has been selected to be 3 (for ease of illustration). The first phase-alternated RF excitation pulse occurs in interval 5, FIG. 3, resulting in a spin-echo signal $S_1'(t)$ which is 180° out of phase with the signal $S_1(t)$. Subsequent phase-alternated RF pulses occur every three views, with the next one occurring in interval 21 of View 4. If, for example, $N_b$ were selected to be 8, then the first phase-alternated excitation pulse would occur at View 4, and then every eight views at Views 12, 20, . . . etc.

Referring again to FIG. 3, signals $S_1(t)$ and $S_1'(t)$, obtained at identical $G_y$ gradient amplitudes, would be used as in Equation (3) to compensate for baseline error in View 1. Additionally, signals $S_1(t)$ and $S_1'(t)$ would be used in Equation (4) to calculate a baseline signal $B_1(t)$. The $B_1(t)$ signal is used to compensate for the error in signal $S_2(t)$ (in View 2) which is closest to signal $S_1(t)$ in View 1. Thus, the corrected signal is obtained by subtracting $B_1(t)$ from the observed signal $S_2(t)$. Similarly, signals $S_4(t)$ and $S_4'(t)$, also obtained at identical $G_y$ gradient amplitudes, occurring in intervals 20 and 24, respectively, are used to compensate for errors in View 4 and also to calculate a new baseline error signal $B_4(t)$. Signal $B_4(t)$ is used to compensate for baseline error components in signal $S_3(t)$ in interval 16 and signal $S_5(t)$, not shown.

In some circumstances, it may be advantageous to use interpolation (e.g., linear) to calculate an interpolated baseline error value $B'(t)$ using $B_1(t)$ and $B_4(t)$. The interpolated value $B'(t)$ would then be used to compensate for baseline error components in signals $S_2(t)$ and $S_3(t)$. Similar interpolated values would be calculated from the other baseline errors $B_i(t)$, $i=7, 10, \ldots$.

The use of the method results in a scan time reduction by a factor of $(1+1/N_b)/2$ relative to the pulse sequence of FIG. 2. Thus, for $N_b=4$ and 8 the reduction in time is by factors of $\frac{5}{8}$ and 9/16, respectively. While these reductions in scan time are significant improvements, there is proposed in accordance with the invention, a new method for reducing or eliminating image artifacts due to baseline error components. Using the inventive method, one of the following advantages can be realized: The minimum scan time can be halved (compared to the scan time of a pulse sequence such as that of FIG. 2), the field of view can be doubled with no increase in scan time, or the resolution in the phase-encoding direction can be doubled with no increase in scan time.

Figure 4:
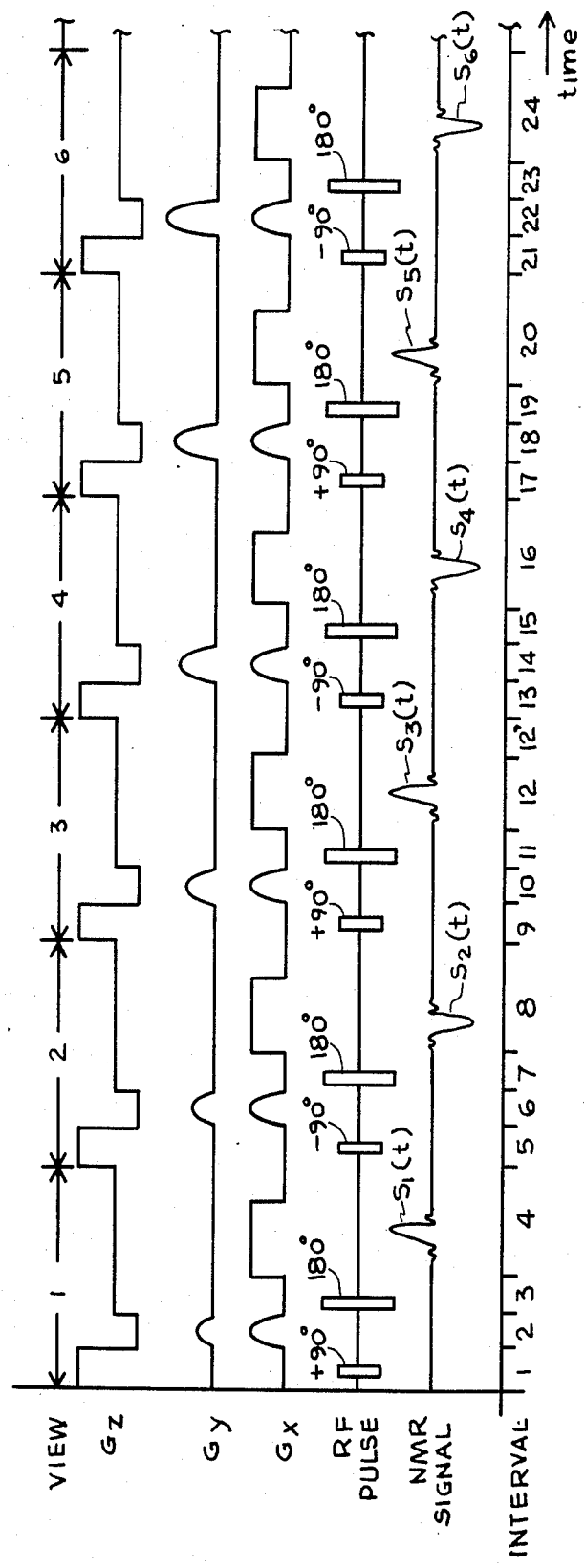
FIG. 4 depicts an exemplary embodiment of a pulse sequence implemented in accordance with the invention.

The method for reducing or eliminating the effects of baseline error component in accordance with the invention will now be described, by way of example, with reference to the pulse sequence of FIG. 4. This pulse sequence is substantially identical to that of FIG. 3, with the notable exceptions that a single RF excitation pulse is used for each view and that the phase of the 90° RF excitation pulses is reversed by 180° in successive adjacent views of the pulse sequence. Thus, in FIG. 4, odd numbered views (e.g., 1, 3, ..., 127) employ a +90° RF pulse, while even numbered views (e.g., 2, 4, ..., 128) utilize a −90° RF excitation pulse. Successive spin-echo signals resulting from the phase-alternated excitation pulses are also phase alternated relative to one another. In this manner, because only one measurement is made for each amplitude of the phase-encoding gradient, the data collection time is shortened significantly.

The inventive method may also be advantageously practised with a pulse sequence in which the order of phase-alternated RF excitation pulses is reversed from that described above. Thus, the odd numbered views may employ −90° RF pulses, while even numbered views use +90° RF pulses.

In the general case, the temporal pulse sequence need not be implemented such that the $G_y$ gradient amplitudes increase monotonically in successive views. In some situations (e.g., reduction or elimination of motion-induced artifacts), it is desirable to select either randomly or pseudo-randomly the temporal sequence of $G_y$ gradient amplitudes. A +90° or a −90° RF excitation pulse is used, depending on whether the selected amplitude corresponds to an odd or even view in a pulse sequence where the amplitudes are increased monotonically. In this manner, when, prior to reconstruction processing, the measured NMR signals are rearranged in order of increasing $G_y$ gradient amplitude, adjacent ones of the NMR signals correspond to those obtained with excitation pulses of opposite phase.

The effect of alternating the phase of the excitation RF pulses for adjacent views, without repeating the amplitude of the phase-encoding gradient pulses in any of the views, is to modulate the desired image up to the Nyquist frequency in the phase-encoding direction. However, the artifact due to baseline error components remains unchanged at the center of the image since it is unaffected by the phase reversal of the RF excitation pulse.

Figures 5A, 5B:
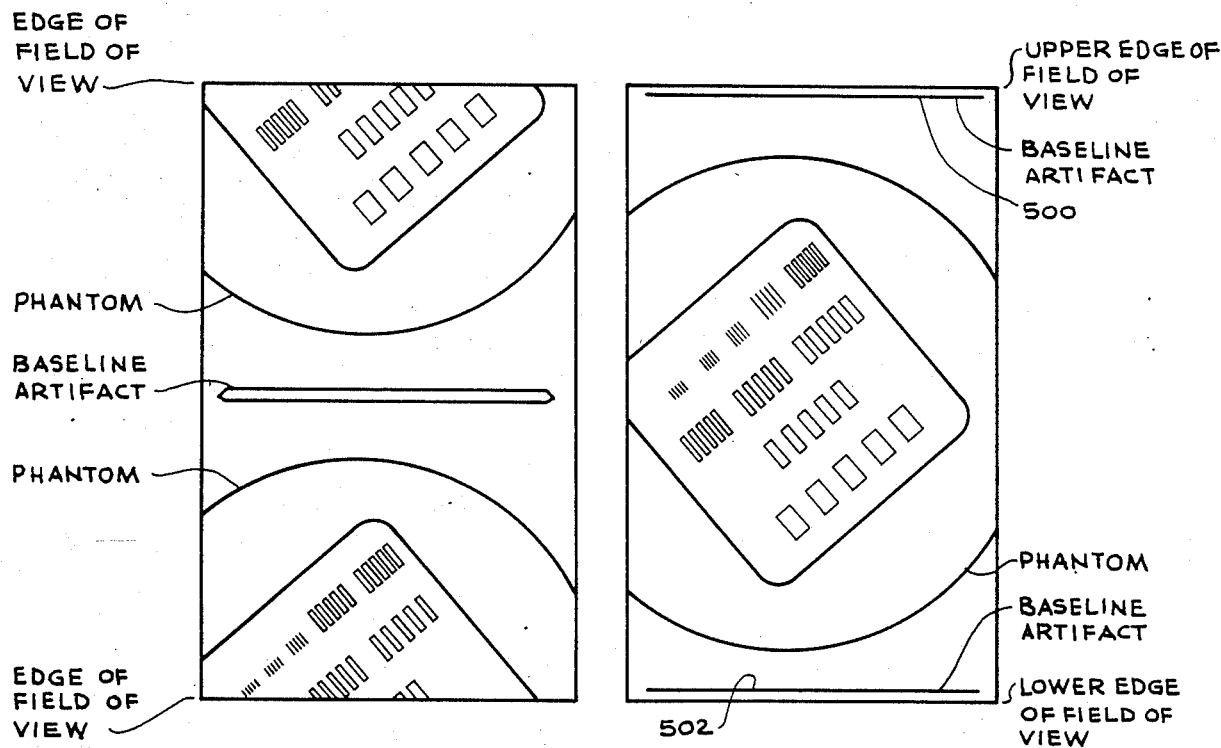
FIG. 5A depicts graphically an image of an NMR phantom modulated to the edge of the field of view, while a baseline error artifact remains unaffected at the vertical center of the image.
FIG. 5B depicts graphically an image of an NMR phantom returned to its correct position in accordance with the invention, while the baseline error artifact is modulated to the edge of the field of view, away from the desired image.

The modulation of the desired image data to the edge of the field of view is graphically illustrated in FIG. 5A which depicts a conventional NMR resolution phantom. Since the desired image data is modulated at the Nyquist frequency in the phase-encoding direction, the image is moved up by half of the scan field of view. The upper image half aliases to the bottom of the field of view. The baseline error artifact remains in the vertical center of the field of view.

Prior to displaying the image, the data should be reformatted and the image returned to the center of the field of view. This can be done by rearranging of the image's pixels. A more preferred method is to negate prior to reconstruction the measurements made using −90° RF excitation pulses. If this is done, the image is restored to its correct position in the field of view, as depicted in FIG. 5B. The step of negating the measurements not only restores the image to its correct position but modulates the baseline error artifact at the Nyquist frequency and as a result of which it is moved up by half the field of view to the edge of the field of view. If a magnitude reconstruction is used, either the views acquired with a +90° RF pulse or those with a −90° RF pulse can be negated. If the sum of the object size and spatial width of the baseline artifact are less than the scan field, the desired image and the artifact will be separated. Since the baseline error component has a narrow frequency bandwidth in the phase-encoded direction, the baseline error artifact is, in fact, separated from the image and is visible as a faint line across the top and bottom of the image, as suggested by lines 500 and 502 in FIG. 5B. If the remaining artifact is objectionable, the scan field of view can be made slightly larger than the displayed field so that the artifact is not visible (with only a small change in the spatial resolution or displayed field of view).

It will be recognized from the foregoing description that, if averaging is not used, the inventive method provides a factor of 2 reduction in scan time compared to the method described with reference to FIG. 2. However, since averaging is not employed, an image obtained with the pulse sequence of FIG. 4 would have the same resolution but a noise level that is higher by $\sqrt{2}$ than those of FIG. 2. The time reduction realized with the inventive method can be employed to increase image resolution in the phase-encoding direction without increasing the data collection time relative to the pulse sequence of FIG. 2. This is accomplished by doubling both the number of phase-encoding views (e.g., from 128 to 256) and the maximum phase-encoding gradient amplitude. The resulting image has increased resolution in the phase-encoding direction, but has again $\sqrt{2}$ the noise level of an image obtained with the pulse sequence of FIG. 2 due to the resolution improvement. The scan time reduction and resolution increase are useful when a trade of signal-to-noise ratio for either time or sharpness is desirable. The reduction in time realized with the method of the invention could also be utilized to increase the field of view over that, for example, obtained with a 128 view sequence of FIG. 2 or FIG. 4. This can be accomplished by doubling the number of views to 256 while maintaining the maximum amplitude of the phase-encoding gradient unchanged. In this manner, the field of view can be doubled, while the scan time, noise level, and resolution remain the same as that obtainable with the pulse sequence of FIG. 2 in which 128 views are employed. The field-of-view increase is useful, since artifacts appearing at the edge of the field of view will not be visible if the displayed field is made smaller than the actual scanned field.

It may occur that the baseline artifact has a great deal of energy. If spatial smoothing is used in the Fourier transform in this case, the spatial extent of the baseline artifact may become excessively large. This problem can be significantly reduced if even a crude estimate of the baseline error is subtracted from all the views prior to negation of the $-90°$ RF views and Fourier transformation. This baseline estimate can be generated by acquiring one or a few measurement pairs with alternative RF excitation but the same phase-encoding amplitude and then using Equation (4) to determine the baseline error. It has been found in one embodiment that three measurement pairs are sufficient to avoid this problem while causing an only slight increase in scan time. Further, it is not necessary to acquire a baseline estimate for each scan since a crude estimate is sufficient.

The preferred embodiments of the invention have been disclosed hereinbefore by way of example with reference to a 2DFT pulse sequence. It will be recognized by those skilled in the art that the invention could also be practiced with a three-dimensional embodiment of the sequence. In this case, variable amplitude $G_z$ phase-encoding gradient pulses would be applied in intervals 2, 6, 10, 14, etc., of FIG. 4 to encode spatial image information in the Z-axis direction. A three-dimensional spin-warp pulse sequence is disclosed and claimed in U.S. Pat. No. 4,431,968, assigned to the same assignee as the present invention and which is incorporated herein by reference as background material. In the three-dimensional implementation, it is necessary to alternate the sign of the RF excitation pulse in adjacent views in only one of the phase-encoding directions, although it could be alternated in all directions with somewhat better results.

It will be further recognized that the invention could also be practiced with other than a Fourier transform type of imaging sequence. Examples of such sequences are two- and three-dimensional implementations of multiple-angle projection reconstruction techniques. In such sequences, NMR projection data is obtained from a plurality of angles (e.g., within at least a 180 degree arc in a two-dimensional implementation) in the sample region of interest. The image is reconstructed by filtering and backprojecting the line integral projection data obtained for each direction. The method of the invention is directly applicable to this sequence if adjacent angular projections are treated as adjacent views. Since adjacent projections will have baseline artifacts of opposite sign and since the baseline error varies only slowly with gradient direction, the baseline artifact will be cancelled. If the change in the signal baseline with gradient direction is very slow, and if enough views are used (comparable or greater in number to the number of pixels across the image), it is not necessary to change the sign of the excitation pulse in adjacent views; a slower alternation is sufficient, for example, every two or four views.

The invention may also be practiced with pulse sequences in which the NMR data is acquired by sampling the free-induction decay signals, rather than spin-echo signals as hereinabove. In this case, the phase-alternated excitation pulses result in phase-alternated FID signals which, for the purpose of eliminating baseline error components, are treated as spin-echo signals. The baseline errors associated with FID signals can be due to A/D converter offsets and other imprecision in the phase detectors.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method for removing the effects of NMR signal baseline error components in NMR imaging techniques, which techniques include a predetermined plurality of views, each of which includes the application of an RF excitation pulse and a phase-encoding magnetic field gradient pulse along at least one dimensional axis of a study object, wherein said gradient pulse is selected to have a different amplitude in each view, said method comprising:

alternating the phase of the RF excitation pulse by 180° in views acquired with adjacent values of gradient amplitudes in at least one direction;

observing the NMR signals resulting from the application of said phase-alternated RF pulses; and constructing an image of the study object.

2. The method of claim 1 further comprising the step of negating alternate ones of the observed NMR signals prior to constructing an image of the study object.

3. The method of claim 1 or 2 wherein the amplitude of said phase-encoding gradient pulse is selected to increase monotonically in the temporal sequence of views.

4. The method of claim 2 wherein odd numbered views include a $+90°$ RF excitation pulse, while even numbered views include a $-90°$ RF pulse.

5. The method of claim 4 wherein said step of negating comprises negating the NMR signals due to the $-90°$ RF pulses.

6. The method of claim 4 wherein said step of negating comprises negating the NMR signals due to the $+90°$ RF pulses.

7. The method of claim 2 wherein odd numbered views include a $-90°$ RF excitation pulse, while even numbered views include a $+90°$ RF pulse.

8. The method of claim 7 wherein said step of negating comprises negating the NMR signals due to the $-90°$ RF pulses.

9. The method of claim 7 wherein said step of negating comprises negating the NMR signals due to the $+90°$ RF pulses.

10. The method of claim 1 or 2 wherein the time sequence of amplitudes of the phase-encoding gradient pulses is selected to be non-monotonic and wherein the phase of the excitation pulse in each view is selected such that when said NMR signals are rearranged in accordance with monotonically increasing amplitudes of the phase-encoding magnetic field gradient, adjacent ones of the rearranged signals are due to RF excitation pulses which are 180° out of phase relative to one another.

11. The method of claim 2 wherein odd numbered rearranged signals are due to $+90°$ RF pulses, while even numbered rearranged signals are due to −90° RF pulses.

12. The method of claim 11 wherein said step of negating comprises negating the NMR signals due to the −90° RF pulses.

13. The method of claim 11 wherein said step of negating comprises negating the NMR signals due to the +90° RF pulses.

14. The method of claim 2 wherein odd numbered rearranged signals are due to −90° RF pulses, while even numbered rearranged signals are due to +90° RF pulses.

15. The method of claim 14 wherein said step of negating comprises negating the NMR signals due to the −90° RF pulses.

16. The method of claim 14 wherein said step of negating comprises negating the NMR signals due to the +90° Rf pulses.

17. A method for removing the effects of NMR signal baseline error components in NMR imaging techniques, which techniques include a predetermined plurality of sequentially implemented views, each of which includes the application of an RF excitation pulse and a magnetic field gradient pulse, said gradient pulse is selected to be oriented in a different direction in each view, said method comprising:
separating the view into two sets, the first set containing approximately one half of the view, and the second containing the remaining views;
using a +90° RF excitation pulse for the views in the first set and a −90° RF excitation pulse for the views in the second set;
observing the NMR signals resulting from the application of said RF excitation pulses; and
negating the observed NMR signals from the views in the first set prior to reconstructing an image of the study object.

18. The method of claim 17 wherein the direction of the gradient pulse is selected to vary monotonically in the temporal sequence of views.

19. The method of claim 18 wherein odd numbered views include a +90° RF excitation pulse, while even numbered views include a −90 ° RF pulse.

20. The method of claim 19 wherein said step of negating comprises negating the NMR signals due to the −90° RF pulses.

21. The method of claim 19 wherein said step of negating comprises negating the NMR signals due to the +90° RF pulses.

22. The method of claim 18 wherein odd numbered views include a −90° RF excitation pulse, while even numbered views include a +90° RF pulse.

23. The method of claim 22 wherein said step of negating comprises negating the NMR signals due to the −90° RF pulses.

24. The method of claim 22 wherein said step of negating comprises negating the NMR signals due to the +90° RF pulses.

25. The method of claim 17 wherein the direction of the magnetic field gradient pulse is selected to vary non-monotonically and wherein the phase of the excitation pulse in each view is selected such that when said NMR signals are rearranged in accordance with monotonically varying directions of the magnetic field gradient, adjacent ones of the rearranged signals are due to RF excitation pulses which are 180° out of phase relative to one another.

* * * * *